(12) United States Patent
Craciun et al.

(10) Patent No.: US 11,346,870 B2
(45) Date of Patent: May 31, 2022

(54) OBSERVATION CIRCUIT FOR OBSERVING AN INPUT IMPEDANCE AT A HIGH FREQUENCY CONNECTOR OF A MOBILE DEVICE TERMINAL AND MOBILE DEVICE TERMINAL COMPRISING SUCH AN OBSERVATION CIRCUIT AND VEHICLE COMPRISING THE MOBILE DEVICE TERMINAL

(71) Applicant: Continental Automotive GmbH, Hannover (DE)

(72) Inventors: Serban Craciun, Hannover (DE); Ioana Sabina Ionescu, Hannover (DE)

(73) Assignee: Continental Automotive GmbH

( * ) Notice: Subject to any disclaimer, the term of this patent is extended or adjusted under 35 U.S.C. 154(b) by 304 days.

(21) Appl. No.: 16/601,836

(22) Filed: Oct. 15, 2019

(65) Prior Publication Data

US 2020/0116769 A1 Apr. 16, 2020

(30) Foreign Application Priority Data

Oct. 15, 2018 (EP) .................................... 18465606

(51) Int. Cl.
*G01R 27/02* (2006.01)
*H01P 5/08* (2006.01)
*H01Q 1/32* (2006.01)

(52) U.S. Cl.
CPC ................ *G01R 27/02* (2013.01); *H01P 5/08* (2013.01); *H01Q 1/32* (2013.01)

(58) Field of Classification Search
CPC ........ G01R 27/02; G01R 27/08; G01R 27/16; G01R 35/005; G01R 27/04; G01R 1/0416; H01P 5/08; H01Q 1/32; H01J 37/32183; H01J 37/32935; H04W 52/52; H04W 52/0251; Y02D 30/70
See application file for complete search history.

(56) References Cited

U.S. PATENT DOCUMENTS 2,459,197 A 1/1949 Stewart, Jr.
4,947,033 A * 8/1990 Kordts .................... G01D 5/248
250/214 R (Continued)

FOREIGN PATENT DOCUMENTS

EP 0496147 A1 7/1992

OTHER PUBLICATIONS

European Search Report dated Apr. 26, 2019 from corresponding European Patent Application No. EP 18465606.4.

*Primary Examiner* — Patrick Assouad
*Assistant Examiner* — Sangkyung Lee

(57) ABSTRACT

The disclosure is directed to an observation circuit for observing an input impedance at a high frequency connector of a mobile device terminal, the observation circuit comprising a measurement circuitry, wherein the measurement circuitry comprises the high frequency connector, a reference impedance, a voltage source, and a voltage meter. A first output electrode of the voltage source is connected to both a first electrode of the high frequency connector and a first input electrode of the voltage meter over the reference impedance, and a second output electrode of the voltage source is connected to both a second electrode of the high frequency connector and a second input electrode of the voltage meter.

9 Claims, 1 Drawing Sheet

(56) References Cited

U.S. PATENT DOCUMENTS

| | | | | |
|---|---|---|---|---|
| 5,414,345 | A * | 5/1995 | Rogers | G01R 29/0814 |
| | | | | 324/612 |
| 5,818,243 | A * | 10/1998 | Wakamatsu | G01R 19/0092 |
| | | | | 324/649 |
| 6,437,577 | B1 * | 8/2002 | Fritzmann | H01Q 1/32 |
| | | | | 324/523 |
| 8,948,713 | B2 | 2/2015 | Kratochwil et al. | |
| 9,356,476 | B2 * | 5/2016 | Yu | H02J 50/80 |
| 2010/0164511 | A1 * | 7/2010 | Hedman | G01D 3/08 |
| | | | | 324/601 |
| 2016/0056664 | A1 * | 2/2016 | Partovi | H02J 50/12 |
| | | | | 307/104 |
| 2016/0226133 | A1 * | 8/2016 | Jung | H01Q 13/106 |

* cited by examiner

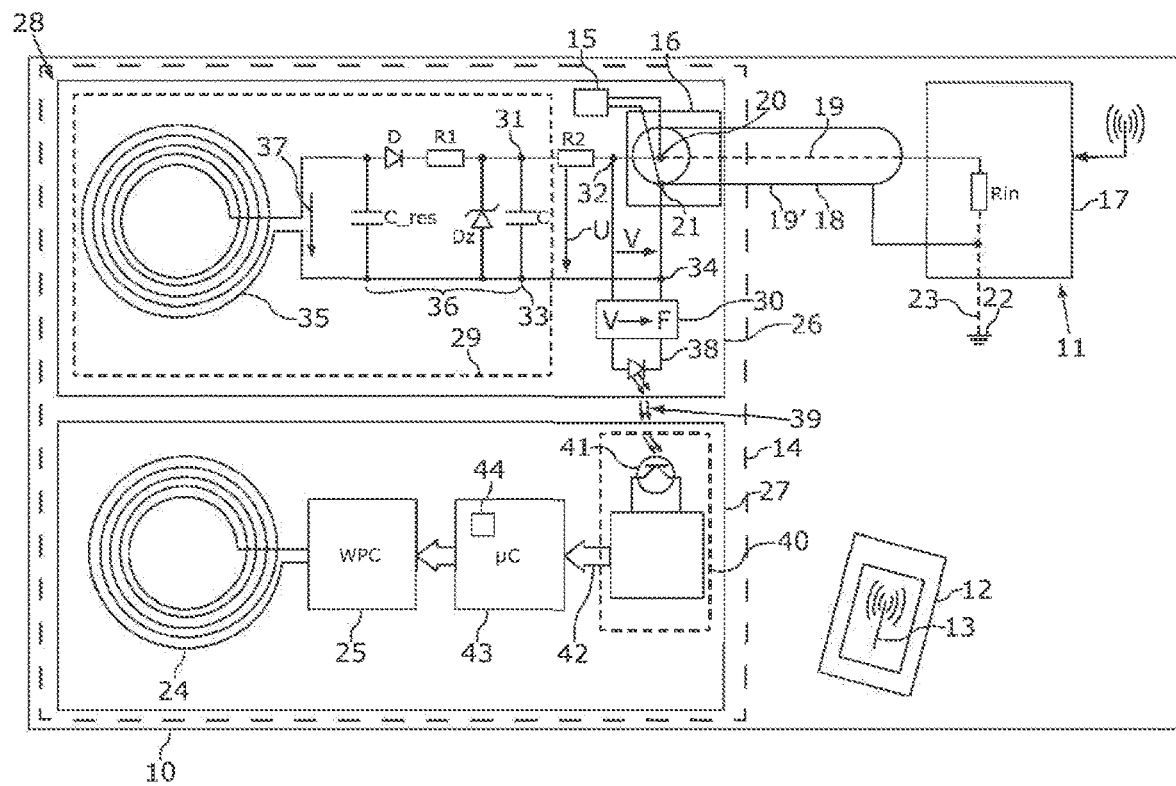

OBSERVATION CIRCUIT FOR OBSERVING AN INPUT IMPEDANCE AT A HIGH FREQUENCY CONNECTOR OF A MOBILE DEVICE TERMINAL AND MOBILE DEVICE TERMINAL COMPRISING SUCH AN OBSERVATION CIRCUIT AND VEHICLE COMPRISING THE MOBILE DEVICE TERMINAL

BRIEF DESCRIPTION OF THE DRAWING

Exemplary embodiments are described in reference to the following drawing:

FIG. 1 depicts a schematic illustration of an exemplary embodiment of the motor vehicle.

DETAILED DESCRIPTION

The disclosure is directed to an electric observation circuit for observing or measuring an input impedance that may be connected to a high frequency connector of a mobile device terminal. Such a high frequency connector may be designed for connecting a coaxial cable which may lead to an antenna, where the input impedance may be active. The mobile device terminal may be provided for resting or keeping a mobile device, e.g., inside a vehicle. A mobile device may be, e.g., a smartphone.

In a mobile device terminal, a coupling antenna may be included which may enable a mobile device to use an additional, external antenna instead of its integrated, internal antenna. To this end, the mobile device terminal may comprise the coupling antenna for exchanging a radio signal with the internal or integrated antenna of the mobile device. The coupling antenna may be connected to the external antenna via a coaxial cable which in turn may be connected to the terminal via a high frequency connector. The external antenna may comprise a so-called compensator module where an adapting resistor or internal resistor may be provided as an input impedance Rin. This input impedance Rin may have a resistance value which may range from 7 k$\Omega$ to up to 300 k$\Omega$, which is a comparatively large range. In order to perform a diagnosis of the compensator module, or to check its internal status, its input impedance Rin can be measured from the mobile device terminal through the coaxial cable as it connects the high frequency connector of the mobile device terminal with the compensator module of the external antenna.

To this end, an observation circuit may be needed in the mobile device terminal. However, such an observation circuit will inevitably have an influence on the coupling antenna, as both the coupling antenna and the observation circuit need to be electrically connected to the high frequency connector as it leads to the connector module of the external antenna. An additional problem arises from the fact, that the input impedance Rin may comprise the described broad resistance range, which demands for large tolerances that in turn may lead to a wrong diagnosis.

The present disclosure describes an exemplary observation circuit for a mobile device terminal.

Advantageous developments with convenient and non-trivial further embodiments of the disclosure are specified in the claims, the instant description, and the drawing.

The disclosure provides an observation circuit for observing an input impedance which may be connected at a high frequency connector ("HF connector") of a mobile device terminal. The high frequency connector may be designed for connecting a coaxial cable which may lead to the compensator module of an external antenna where in turn the input impedance may be located. The observation circuit comprises a measurement circuitry. This measurement circuitry is configured to measure the input impedance. The measurement circuitry comprises said high frequency connector, a reference impedance, a voltage source, and a voltage meter. The voltage meter may be designed to measure an electric voltage between its first and its second input connector. It may be designed as an electronic circuit for generating an output signal as a function of a voltage value of the measured voltage.

The exemplary observation circuit is configured so that a first output electrode of the voltage source is connected to both a first electrode of the high frequency connector and a first input electrode of the voltage meter over the reference impedance. In other word, a source voltage at the output electrode of the voltage source has to pass through the reference impedance in order to get to both the first electrode of the high frequency connector and to the first input electrode of the voltage meter.

A second output electrode of the voltage source is connected to both a second electrode of the high frequency connector and a second input electrode of the voltage meter. In the case that the high frequency connector is configured to connect a coaxial cable, one of the electrodes (first or second electrode of the high frequency connector) provides an electric contact to the core of the coaxial cable and the other electrode provides an electric contact to the outer sheath or shield of the coaxial cable.

The measurement circuitry provides an impedance voltage divider (especially a resistor voltage divider) which allows for measuring a voltage drop over the input impedance as it may be connected between the first and the second electrode of the high frequency connector. A voltage divider provides robust means for measuring the input impedance that may be connected to the high frequency connector. Additionally, the arrangement of a voltage source and the voltage divider provides the advantage, that no reference potential is needed for the observation of the input impedance such that an influence on a coupling antenna can be reduced.

The disclosure also contemplates embodiments, which provide additional advantages.

In one embodiment the voltage source and/or the measurement circuitry as a whole is disconnected from a ground potentiation of the observation circuit such that an electric potential of the measurement circuitry is floating freely. Because of a floating supply circuit, no current through the ground potential is necessary for the measurement. This reduces the influence of any other elements of the measurement circuitry, especially the described coupling antenna.

To provide a voltage source with a freely floating potential, the voltage source may comprise a battery. In one embodiment, the voltage source comprises a receiver coil for receiving a time-variant magnetic field and the voltage source is designed to rectify a voltage generated by the receiver coil and to inject the rectified voltage through the reference impedance into the high frequency connector. In other words, the rectified voltage is provided between the fist and the second output electrode such that a current may be injected through the reference impedance and the input impedance as it may be connected to the high frequency connector. The rectified voltage may be injected through the reference impedance into a coaxial cable connected to the high frequency connector. The receiver coil provides the advantage that no exchange of an exhausted battery is necessary.

In one embodiment the voltage source comprises a shunt regulator for rectifying the voltage. This provides the advantage that a voltage value of the rectified voltage is known and set independently of a voltage value of the voltage generated by the receiver coil. The receiver coil may be provided by at least one track of a first circuit board. This provides the advantage that no separate wiring is needed in the observation circuit.

In one embodiment the observation circuit comprises a wireless power charging circuitry (WPC-Wireless Power Charging) for powering a charging induction coil for wirelessly charging the mobile device, wherein the induction coil and the receiver coil are arranged in a sandwich arrangement. In other words, the mobile device terminal also provides the possibility for WPC. The induction coil function as a charging coil for a mobile device. By arranging the induction coil next to the receiver coil, a time-varying magnetic field generated by the induction coil may also be used as an energy source for powering the voltage source of the measurement circuitry. To this end, the induction coil and the receiver coil may be arranged in the described sandwich arrangement such that for example the receiver coil and the induction coil may be placed next to each other and/or in a coaxial manner. The wireless power charging circuitry may energize the induction coil by means of a ping signal or impulse signal which will generate a voltage in the receiver coil. The induction coil may be arranged between a first circuit board and a second circuit board. This provides for a compact arrangement.

In one embodiment the voltage meter of the measurement circuitry comprises a converter element for converting a voltage measured between the first and the second input electrode of the voltage meter into a transmission signal for a galvanically separating signal transmission. In other words, the voltage value of the voltage controls a value of the transmission signal which may be received or used for observing the input impedance. By using a transmission signal for a galvanically separating signal transmission, no direct electric connection to the observation circuit and therefore to a coupling antenna is necessary for observing the input impedance at the high frequency connector. A signal transmission may be based on a radio transmission, e.g. a Bluetooth transmission.

In one embodiment the convert element comprises a voltage to frequency converter which is designed to set a pulse frequency of a light source. The light source can be, e.g., a light emitting diode. The pulse frequency is set as a function of the measured voltage, i.e. the voltage measured between the first and the second input electrode of the voltage meter. Additionally, a photoelectric receiver is designed to receive an optical signal of the light source as the said transmission signal. Such a photoelectric receiver may comprise a photo transistor for example. The light source may generate an optical signal in the visual frequency range and/or in the infrared range. A microcontroller may be designed to receive an output signal of the photoelectric receiver. Thus, the observation of the input impedance may comprise computer instructions which may be executed by the microcontroller. For example, if the input impedance comprises a value which is out of a predefined accepted range, an error signal may be generated by the microcontroller.

The disclosure also contemplates the mobile device terminal for coupling an integrated or internal antenna of a mobile device to a compensator module of an external antenna. A mobile device, a smartphone or a tablet PC or a smartwatch may be provided. The compensator module may be configured to adapt the impedance of the external antenna to an impedance needed at a high frequency connector of the mobile device terminal. To this end, the compensator module may comprise an input impedance, which can be an input resistor Rin. The mobile device terminal comprises a coupling antenna for exchanging a radio signal for mobile communication with the internal antenna. In other words, no electric connection is needed between the mobile device and the mobile device terminal. The mobile communication may be based on GSM, UMTS and/or 5G. The mobile device further comprises the said high frequency connector for connecting the mobile device terminal to the compensator module over a coaxial cable. In the mobile device terminal the coupling antenna and the high frequency connector are electrically connected.

In order not to disturb the mobile communication, the mobile terminal device comprises an observation circuit according to an embodiment of the disclosure for observing the internal impedance of the compensator module via the high frequency connector. The observation is done in the described way.

The disclosure also contemplates a motor vehicle comprising an external antenna with a compensator module. Such an external antenna may be arranged, for example, on a roof of the motor vehicle. The vehicle comprises a mobile device terminal according to the disclosure for coupling a mobile device to the external antenna. The mobile device terminal may also comprise charging capabilities for WPC as has been described.

The motor vehicle can be configured as a passenger vehicle or a truck or a motor cycle.

The embodiment explained below is a preferred embodiment. However, in the embodiment, the described components of the embodiment each represent individual features which are to be considered independently of each other and which each develop the aspect also independently of each other and thereby are also to be regarded as a component of an aspect in individual manner or in another than the shown combination. Furthermore, the described embodiment can also be supplemented by further features of the disclosure already described.

In the figure elements that provide the same function are marked with identical reference signs.

The figure shows a vehicle 10 which may comprise an external antenna 11 that may be, e.g. mounted on a roof of vehicle 10.

In vehicle 10, the external antenna 11 may also be used by a mobile device 12 in the sense that mobile device 12 may establish a mobile connection or wireless connection using its internal antenna 13 which may be coupled to the external antenna 11. To this end, vehicle 10 may comprise a mobile device terminal 14 which may provide, for example, a place for arranging mobile device 12. In terminal 14, a coupling antenna 15 may be provided which may exchange a radio signal with the internal antenna 13 of the mobile device 12. The coupling antenna 15 may be connected to the external antenna 11 in the following way. The coupling antenna 15 may be connected to a high frequency connector 16 which may be connected to a coupling module 17 of external antenna 11 over a coaxial cable 18. For connecting a core 19 of coaxial cable 18, the high frequency connector 16 may comprise a first electrode 20. For connecting the shield or outer conductor 19' of coaxial cable 18, the high frequency connector 16 may provide a second electrode 21. Coupling antenna 15 may be connected to both electrodes 20, 21. The coupling module 17 may comprise an internal impedance in the form of an internal resistor Rin. The compensation module 17 may optionally be connected to a ground potential 22 of the vehicle 10 over a ground connection 23.

The terminal 14 may also provide WPC capability by providing an induction coil 24 for generating a time-variant magnetic signal. The induction coil 24 may be driven or powered by a WPC circuitry 25 in the known way.

The coupling antenna 15 and the high frequency connector 16 may be arranged on a first circuit board 26. The WPC circuitry 25 may be arranged on a second circuit board 27. The induction coil 24 may be arranged between the two circuit boards 26, 27 such that the two circuit boards 26, 27 and the indication coil 24 form a sandwich arrangement.

Terminal 14 may provide the capability of observing the intern resistor Rin of compensation module 17 via the high frequency connector 16. To this end, terminal 14 may provide an observation circuit 28 which may comprise of a voltage source 29, a reference impedance R2 and a voltage meter 30. A first output electrode 31 of voltage source 29 may be connected over the reference impedance R2 to both the first electrode 20 of the high frequency connector 16 and a first input electrode 32 of voltage meter 30. A second electrode 33 of voltage source 29 may be connected to the second electrode of high frequency connector 16 and a second input electrode 34 of voltage meter 30. Voltage meter 30 may be designed to measure a voltage V between its two input electrodes 32, 34.

Voltage source 29 may generate a rectified voltage between its two output electrodes 31, 33. Voltage source 29 may comprise a receiver coil 35 and a shunt regulator 36 for rectifying a voltage 37 generated by the receiver coil 35. Shunt regulator 36 may comprise an input capacitor C_res, a diode D for rectification, a resistor R1, a Zener diode Dz and a output capacitor C. Shunt regulator 36 may be configured as known in the art. A first input electrode of the shunt regulator may be connected to the first output electrode 31 of the voltage source 29 through the diode and the resistor R1. A second input electrode of shunt regulator 36 may be connected to the second output electrode 33 of the voltage source 29. The Zener diode Dz and the output capacitor C connect the output electrodes 31, 33 of the voltage source 29. The rectified voltage capital U provided by the voltage source 29 is divided by the voltage divider that comprises the reference impedance R2 and the input impedance Rin. Depending on the value of Rin, the voltage V measured by voltage meter 30 results. Voltage meter 30 may be designed to control a light source 38, e.g. a light emitting diode, which may generate an optical signal 39 for signaling the value of voltage V to a photoelectric receiver 40 which may comprise a phototransistor 41. Voltage meter 30 may comprise a circuitry for transforming the value of voltage V in a frequency value of a frequency of impulses controlling the light source 38. A corresponding circuitry is well known from the prior art. The photoelectric receiver 40 may transform a frequency of electric impulses controlled by the optical signal 39 in the phototransistor 41 into an output signal 42 which may be provided to a microcontroller 43 which may verify whether the voltage V fulfills a predefined criterion 44 signaling that the input resistance Rin has a correct or predefined value.

Microcontroller 43 may also control the WPC circuitry 25 for generating an impulse or ping signal for generating time-variant magnetic field which may generate the voltage 37 in the receiver coil 35.

Overall, a solution is provided with a circuitry used for performing a diagnosis on a mobile communication circuit, e.g. a GSM circuit. The terminal can provide two circuit boards 26, 27 placed on top of each other to perform a sandwich structure or sandwich arrangement. One circuit board 26 may comprise the coupling antenna 15, an optional NFC antenna and an optional temperature sensor. The high frequency connector 16 may interconnect the coupling antenna 15 with the compensator module 17 of the external antenna 11. The other circuit board 27 may contain main electronics for a WPC circuitry and optionally for NFC. Wireless charging induction coil 24 may be placed between the two circuit boards 26, 27.

A floating supply circuit or voltage source 29 is provided which may be based on a shunt regulator (D, R1, DZ and C). This voltage source 29 may contain a receiver coil 35 which may be based on PCB traces (PCB-printed circuit board) placed above the induction coil 24 such that an impulse or a ping signal received from the induction coil 24 may energize the receiver coil 35.

The benefits of the floating supply is that the path of the injective voltage U will be the same with the return path, i.e. no current will flow through any ground potential or ground potential 22 on the compensator side of compensator module 17. The received time-variant magnetic field of the induction coil 24 can be rectified and stabilized by the shunt regulator 36 and the rectified voltage U may then be injected through the serial reference resistor L2 to the coaxial cable 18. The resistor voltage divider made by R2 and Rin and the voltage drop over Rin, i.e. voltage V, is measured and converted to a pulse signal by the voltage meter 30. The voltage meter may comprise a voltage-to-frequency converter element V-F for setting a rate or frequency of the pulses of the pulse signal as a function of the voltage value of the voltage V. The voltage meter 30 may drive an LED as light source 38. The photoelectric receiver 40 may be arranged on the circuit board 27 and may couple the phototransistor 41 to the microcontroller 43 which may measure the pulse frequency as the output signal 42 and may then calculate a corresponding resistance value of the input resistance Rin.

As a result, reduced errors in resistance measurements due to no current leakage into the ground potential 22 is provided, as a galvanically isolated circuit is used. Additionally, no direct connection between the circuit board 27 and the coupling antenna 15 from the circuit board 26 is necessary which leads to better mobile communication performance.

Overall, the example shows how a circuit for GSM compensator diagnosis can be provided.

The invention claimed is:

1. Observation circuit for observing an input impedance at a high frequency connector of a mobile device terminal, the observation circuit comprising:
   a measurement circuitry, wherein the measurement circuitry comprises the high frequency connector, a reference impedance, a voltage source, and a voltage meter,
   wherein
      a first output electrode of the voltage source is connected to both a first electrode of the high frequency connector and a first input electrode of the voltage meter over the reference impedance,
      a second output electrode of the voltage source is connected to both a second electrode of the high frequency connector and a second input electrode of the voltage meter, and
      the voltage source comprises a receiver coil configured to receive a time-variant magnetic field and the voltage source is configured to rectify a voltage generated by the receiver coil and to inject the rectified voltage through the reference impedance into the high frequency connector.

2. Observation circuit as claimed in claim 1, wherein at least one of the voltage source or the measurement circuitry is disconnected from a ground potential of the observation circuit such that an electric potential of the measurement circuitry is floating freely with regard to the ground potential.

3. Observation circuit as claimed in claim 1, wherein the voltage source comprises a shunt regulator configured to rectify the voltage.

4. Observation circuit as claimed in claim 1, wherein the receiver coil is based on traces of a first circuit board of the observation circuit.

5. Observation circuit as claimed in claim 1, wherein the observation circuit comprises a wireless power charging circuitry configured to power a charging induction coil configured to wirelessly charge a mobile device, wherein the induction coil and the receiver coil are arranged in a sandwich arrangement.

6. Observation circuit as claimed in claim 1, wherein the voltage meter of the measurement circuitry comprises a converter element configured to convert a voltage measured between the first and the second input electrode of the voltage meter into a transmission signal configured to galvanically separate signal transmission.

7. Observation circuit as claimed in claim 6, wherein the converter element comprises a voltage-to-frequency converter which is designed to set a pulse frequency of a light source as a function of the measured voltage and wherein a photoelectric receiver is designed to receive an optical signal of the light source as the transmission signal and wherein a microcontroller is designed to receive an output signal of the photoelectric receiver.

8. Mobile device terminal for coupling an internal antenna of a mobile device to a compensator module of an external antenna, wherein the mobile device terminal comprises a coupling antenna configured to exchange a radio signal configured to facilitate mobile communication with the internal antenna and wherein the mobile device terminal comprises a high frequency connector configured to connect the mobile device terminal to the compensator module over a coaxial cable, wherein the coupling antenna and the high frequency connector are electrically coupled, wherein the mobile device terminal comprises an observation circuit as claimed in claim 1 configured to observe an internal impedance of the compensator module.

9. Motor vehicle comprising an external antenna with a compensator module, wherein the motor vehicle comprises a mobile device terminal as claimed in claim 8 configured to couple an internal antenna of a mobile device to the external antenna.

* * * * *